United States Patent [19]
Yamaguchi

[11] Patent Number: 5,698,470
[45] Date of Patent: Dec. 16, 1997

[54] FABRICATION METHOD OF MULTILAYER PRINTED WIRING BOARD

[75] Inventor: Masahiro Yamaguchi, Tokyo, Japan

[73] Assignee: NEC Corporation, Tokyo, Japan

[21] Appl. No.: 772,886

[22] Filed: Dec. 24, 1996

[30] Foreign Application Priority Data

Dec. 27, 1995 [JP] Japan .................. 7-341518

[51] Int. Cl.⁶ .................................. H01L 21/60
[52] U.S. Cl. ................ 437/209; 437/185; 437/195
[58] Field of Search .................. 437/209, 189, 437/192, 194, 195, 203

[56] References Cited

U.S. PATENT DOCUMENTS

| | | | |
|---|---|---|---|
| 5,162,258 | 11/1992 | Lemnios et al. | 437/184 |
| 5,190,894 | 3/1993 | Taneda et al. | 437/195 |
| 5,262,353 | 11/1993 | Sun et al. | 437/195 |
| 5,304,510 | 4/1994 | Suguro et al. | 437/195 |
| 5,306,670 | 4/1994 | Mowatt et al. | 437/209 |
| 5,385,867 | 1/1995 | Ueda et al. | 437/189 |
| 5,482,900 | 1/1996 | Yang | 437/195 |

FOREIGN PATENT DOCUMENTS

| | | |
|---|---|---|
| 5-7094 | 1/1993 | Japan . |
| 5-7095 | 1/1993 | Japan . |
| 5-136575 | 6/1993 | Japan . |

*Primary Examiner*—Kevin Picardat
*Attorney, Agent, or Firm*—Laff, Whitesel, Conte & Saret Ltd.

[57] ABSTRACT

A fabrication method of a multilayer PWB that makes it possible to fabricate a multilayer PWB at low fabrication cost without the assembly and pressing processes. First, a first insulating layer serving as an undercoating layer is formed on a first patterned conductive layer and the uncovered surface of an insulating substrate. Next, the first insulating layer is exposed to light, thereby partially curing the first insulating layer. The combination of a second insulating layer and a second conductive layer is laminated under heat on the partially-cured first insulating layer so that the second insulating layer is contacted with the first insulating layer. During this step, the first insulating layer is heated and softened, thereby reducing its surface irregularity. The first and second insulating are then heated and entirely cured, and simultaneously, the substrate, the first conductive layer, the first insulating layer, the second insulating layer, and the second conductive layer are combined with each other. Thereafter, penetrating holes are formed to vertically penetrate the substrate, and the second conductive layer is patterned to form an outer circuit.

6 Claims, 3 Drawing Sheets

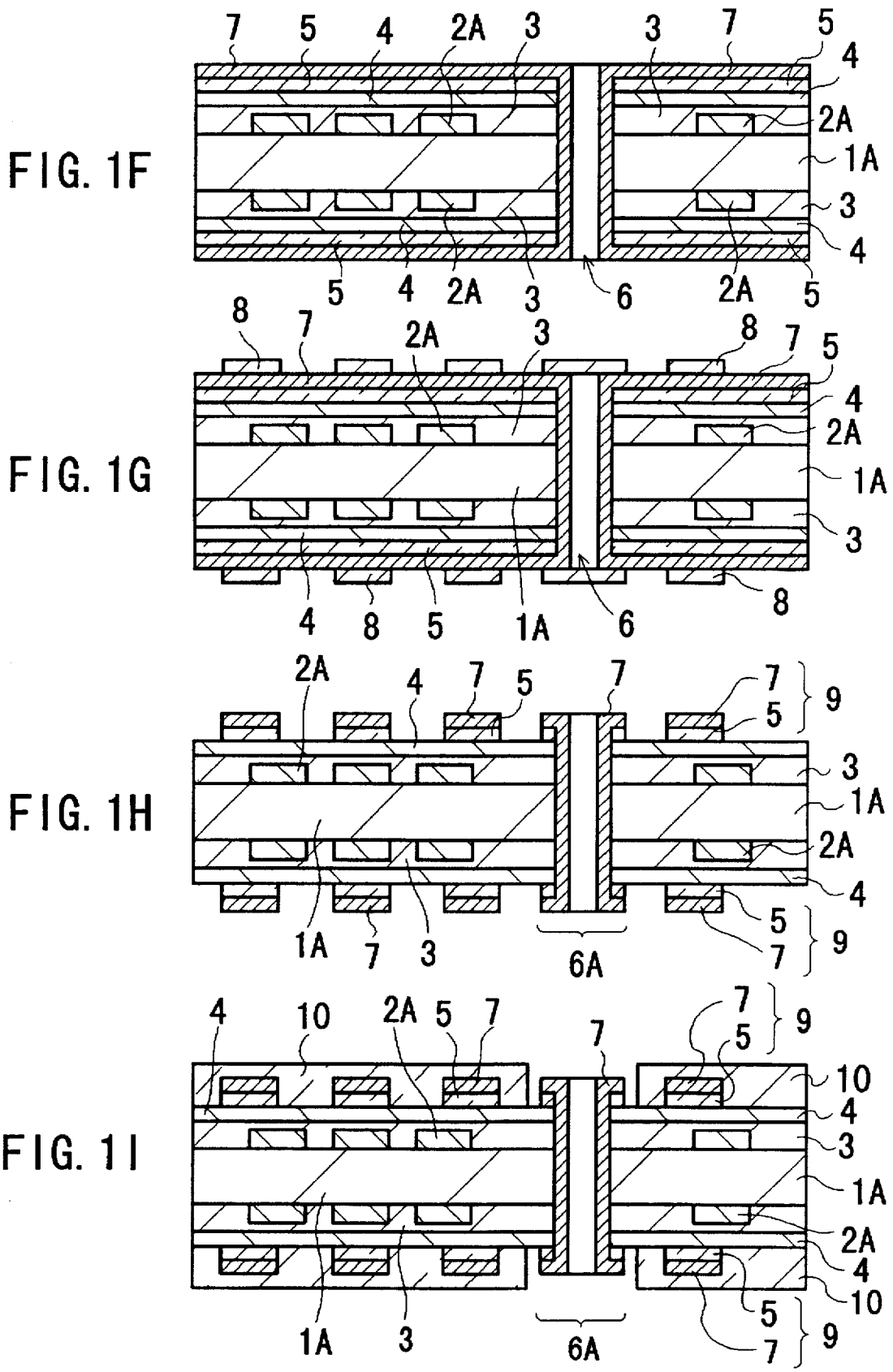

FABRICATION METHOD OF MULTILAYER PRINTED WIRING BOARD

BACKGROUND OF THE INVENTION

1. Field of the Invention

The present invention relates to a fabrication method of a multilayer Printed Wiring Board (PWB) and more particularly, to a fabrication method of a multilayer PWB that is capable of fabrication of the multilayer PWB through at low fabrication cost without polishing and pressing processes.

2. Description of the Prior Art

Conventionally, a double-sided multilayer PWB was typically fabricated in the following way.

First, a copper-clad laminate is prepared, which has an insulating substrate and two copper foils laminated on both surfaces of the substrate, respectively.

Second, the copper foils of the copper-clad laminate are patterned to form an inner circuit or circuits. Thus, a patterned copper-clad laminate is obtained.

Third, prepreg layers are deposited on the patterned copper foils of the patterned copper-clad laminate, respectively.

Fourth, outer copper foils are stacked on the prepreg layers deposited at both sides of the laminate, respectively, resulting in a PWB assembly.

Finally, the PWB assembly made of the patterned copper-clad laminate, the prepreg layers, and the outer copper foils is pressed under heat using a pressing machine to thereby combine with each other.

Thus, the conventional double-sided multilayer PWB is finished.

Instead of the outer copper foils, further patterned copper-clad laminates each having patterned copper foils may be used.

The conventional, typical fabrication method described above has a problem that an assembly process of forming the PWB assembly is necessary and a problem that the pressing process takes a long time.

Another conventional fabrication method of the PWB was disclosed in the Japanese Non-Examined Patent Publication Nos. 5-7094 and 5-7095, both of which were published in January 1993.

In this method, two rolled copper foils each having an adhesive layer deposited on a surface of the foil is used. These two rolled copper foils are pulled out and placed on both surfaces of a patterned copper-clad laminate having an inner circuit or circuits with the use of a roll laminator. The assembly of the patterned copper-clad laminate, the copper foils, and the adhesive layers are then pressed under heat using a pressing machine to thereby combined with each other.

With the conventional method disclosed in the Japanese Non-Examined Patent Publication Nos. 5-7094 and 5-7095, one of the above problems that the assembly process is necessary is able to be solved. However, the other of the above problems that the pressing process takes a long time remains unsolved.

Still another conventional fabrication method of the PWB was disclosed in the Japanese Non-Examined Patent Publication No. 5-136575, which was published in June 1993. This method is able to solve not only the above problem that the assembly process is necessary but also the above problem that the pressing process takes a long time.

In this method, first, two undercoating insulating layers are coated on each surface of a patterned copper-clad laminate having inner circuits. These undercoating insulating layers are made of a photo-setting insulating resin.

Then, two interlayer insulating films are laminated on the undercoating insulating layers, respectively. The interlayer insulating films are made of a photo-setting insulating resin.

Subsequently, the undercoating insulating layers and the interlayer insulating films are exposed to ultraviolet (UV) light, thereby curing these layers and films.

Two adhesive films for a subsequent additive plating process are then laminated on the interlayer insulating films thus cured, respectively. Two plating catalyst layers are formed on the adhesive films, respectively. Two plating resist layers are selectively formed on the catalyst layers, respectively.

Finally, two conductive metal layers are plated on the interlayer insulating layers to thereby selectively form two outer circuits thereon, respectively. The outer circuits are located at the area where the plating resist layers have not been formed.

The conventional fabrication method disclosed in the Japanese Non-Examined Patent Publication No. 5-136575 is preferably applied to the fabrication of ultrahigh-density PWBs whose circuit line width is 80 µm or less. However, this method has a problem that the fabrication cost is high, because the outer circuits are formed with the use of an additive plating process.

Also, this method requires a polishing process to remove the surface irregularity of the cured undercoating insulating layers after their coating process. The surface irregularity is generated corresponding to the geometric shapes of the inner circuits.

SUMMARY OF THE INVENTION

Accordingly, an object of the present invention is to provide a fabrication method of a multilayer PWB that makes it possible to fabricate a multilayer PWB at low fabrication cost without the above-described assembly and pressing processes.

Another object of the present invention is to provide a fabrication method of a multilayer PWB that requires no polishing process and no pressing process.

A fabrication method of a multilayer PWB according to the present invention includes the following steps:

First, an insulating substrate having a first patterned conductive layer serving as an inner circuit are prepared. The first patterned conductive layer is adhered on a surface of the substrate.

Next, a first insulating layer serving as an undercoating layer is formed on the first conductive layer and the uncovered surface of the substrate.

The first insulating layer is made of a material having a photo-setting property that cures by exposure to light, a softening property that softens at a first temperature higher than the room temperature, and a thermosetting property that cures at a second temperature or higher. The second temperature is higher than the first temperature.

The first insulating layer is then exposed to light, thereby partially curing the first insulating layer.

On the other hand, a second insulating layer is formed on a surface of a second conductive layer to be coupled therewith.

The second insulating layer is made of a material having a thermosetting property that cures at a third temperature or higher. The third temperature is higher than the first temperature.

The combination of the second insulating layer and the second conductive layer is laminated under heat on the partially-cured first insulating layer so that the second insulating layer is contacted with the first insulating layer. During this step, the first insulating layer is heated up to the first temperature, thereby softening the first insulating layer to reduce its surface irregularity.

The first and second insulating layers are then heated at a temperature equal to or higher than the second and third temperatures, thereby entirely curing the first and second insulating layers and combining the substrate, the first conductive layer, the first insulating layer, the second insulating layer, and the second conductive layer with each other.

Thereafter, penetrating holes vertically penetrating the substrate are formed, and the second conductive layer is patterned to form an outer circuit.

With the method according to the present invention, after preparing the insulating substrate having the first patterned conductive layer serving as an inner circuit, the first insulating layer serving as an undercoating layer is formed on the first conductive layer and the exposed surface of the substrate.

Then, the combination of the second insulating layer and the second conductive layer is laminated on the partially-cured first insulating layer under heat so that the second insulating layer is contacted with the first insulating layer. During this step, the first insulating layer is heated and softened to reduce its surface irregularity.

Further, the first and second insulating layers are heated so that they are entirely cured, thereby combining the insulating substrate having the first patterned conductive layer, the first insulating layer, the second insulating layer, and the second conductive layer combined with each other.

Therefore, no assembly process and no pressing process of the insulating substrate having the first patterned conductive layer, the first insulating layer, the second insulating layer, and the second conductive layer are required.

Also, the second conductive layer is patterned to form the outer circuit. In other words, the outer circuit is formed with the use of a subtractive process.

As a result, a multilayer PWB is able to be fabricated at low fabrication cost without arising the above-described problems about the assembly and pressing processes.

Additionally, during the laminating process of the second conductive layer and the second insulating layer under heat, the first insulating layer is heated to be softened, thereby reducing its surface irregularity. As a result, no polishing process of the partially-cured first insulating layer is needed.

The insulating substrate having the first patterned conductive layer is preferably formed by a well-known copper-clad laminate. However, any other insulating substrate may be used if it has a patterned conductive layer capable of serving as the inner circuit. The first patterned conductive layer may be made of any conductive material.

The first insulating layer may be made of any material if it has the above-identified properties.

The step of forming the first insulating layer is preferably performed by a screen printing process because this process enables the reduced surface irregularity of the first insulating layer. However, any other process may be applied to this step.

The second conductive layer is preferably made of a copper foil. However it may be made of any other conductive material.

The second insulating layer may be made of any material if it has the above-identified properties.

The step of laminating the combination of the second conductive layer and the second insulating layer may be performed by any laminating process. However, it is preferred that this step is performed by using a roll laminator.

The step of forming the penetrating holes may be performed before and after the step of patterning the second conductive layer.

In a preferred embodiment of the method according to the present invention, the first temperature of the first insulating layer is in the range from 50° C. to a temperature at which the glass transition phenomenon of the material of the first insulating layer starts. The reason is that the first insulating layer is able to be softened without arising any problem if the first temperature is in this range.

In this case, more preferably, the first temperature is in the range from 60° C. to 80° C. The reason is that the first insulating layer is more surely softened without arising any problem if the first temperature is in this range.

In another preferred embodiment of the method according to the invention, the material of the first insulating layer is an insulating mixture essentially consisting of a bisphenol A epoxy resin, an acrylic polymer, an epoxy acrylate, a photo-polymerization initiating agent, and a thermally curing agent.

In this case, the wanted properties of the first insulating layer are readily realized.

In still another preferred embodiment of the method according to the invention, the material of the second insulating layer is an insulating mixture essentially consisting of a bisphenol A epoxy resin, a thermally curing agent, and a solvent. The mixture is coated on the surface of the second insulating layer and is then dried, thereby forming the second insulating layer. In this case, the wanted property of the second insulating layer is readily realized.

In a further preferred embodiment of the method according to the invention, the combination of the second conductive layer and the second insulating is laminated by using a roll laminator. The roll laminator includes a roll around which the combination of the second conductive layer and the second insulating is wound. During the lamination step, the first insulating layer is heated through the roll that has been heated. In this case, an advantage that the lamination step is able to be simply realized occurs.

BRIEF DESCRIPTION OF THE DRAWINGS

FIGS. 1A to 1I are partial cross-sectional views showing a fabrication method of a multilayer PWB according to an embodiment of the present invention, respectively.

DETAILED DESCRIPTION OF THE PREFERRED EMBODIMENTS

Figure 1A:
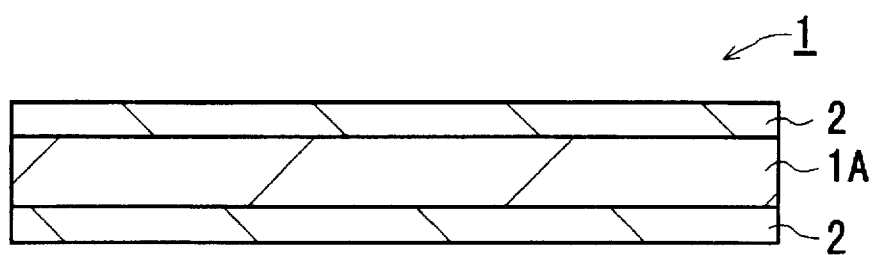

A preferred embodiment of the present invention will be described below referring to the drawings attached.

In a fabrication method of a multilayer PWB according to an embodiment of the invention, first, a copper-clad laminate 1 is prepared, which has an insulating substrate 1A and two copper (Cu) foils 2 respectively formed on two surfaces of the substrate 1A, as shown in FIG. 1A.

Figure 1B:
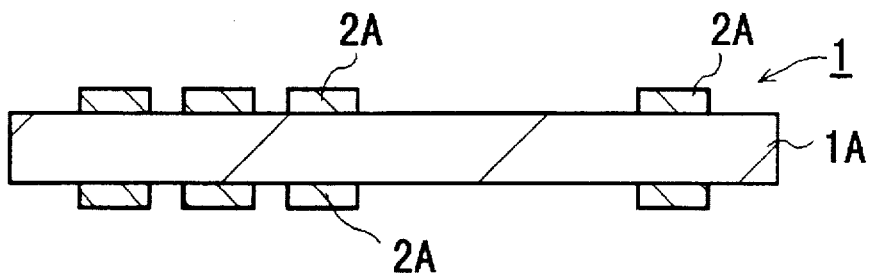

Next, the copper foils 2 are patterned to form inner circuits 2A on the surfaces of the substrate 1A through known processes, respectively, as shown in FIG. 1B. This patterning process is performed, for example, in the following way.

Dry-film photoresist layers (not shown) are first laminated on the copper foils 2 and, masking films (not shown) are formed on the photoresist layers, respectively. Next, the photoresist layers are exposed to UV light through the masking films, thereby selectively curing the photoresist layers. The cured photoresist layers are then developed to selectively remove the exposed or unexposed areas of the photoresist layers, resulting in patterned etching masks. Subsequently, using the masks thus obtained, the copper foils 2 are selectively etched to form the wanted inner circuits 2A on the surfaces of the substrate 1A, respectively. Finally, the masks are removed from the foils 2.

Further, to increase the adhesion or bonding strength of the inner circuits 2A with first insulating layers 3 that will be formed on the circuits 2A in a subsequent step, the copper-clad laminate 1 thus patterned is subjected to a blackening process to oxidize and roughen the surfaces of the inner circuits 2A. This process is not illustrated in the attached figures.

The first insulating layers 3 serving as undercoating layers are formed by a screen printing process on the inner circuit 2A and the exposed or uncovered surfaces of the substrate 1A, respectively.

The first insulating layers 3 are made of a material having a photo-setting property that cures due to exposure to UV light, a softening property that softens at a temperature of 60° C. (which is higher than the room temperature, i.e., 25° C.), and a thermosetting property that cures at a temperature of 100° C. or higher.

Here, the material of the first insulating layers 3 is an insulating mixture essentially consisting of a bisphenol A epoxy resin of 50 to 60 weight %, an epoxy acrylate of 10 to 30 weight %, a dicyandiamide of 10 to 30 weight % as a thermally curing agent, and 2,2 dimethoxy-2-phenylacetophenone of 1 to 5 weight % as a photo-polymerization initiating agent. The mixture has a viscosity of 20 to 30 poises (PS).

To limit the surface irregularity of the first insulating layers 3 to a level of 10 µm or less, the screen printing process is performed under the following condition. Also, to accomplish the same purpose, the thickness of the layers 3 is set as 20±5 µm on the surfaces of the inner circuits 2A.

screen mesh: 80 T hardness of the squeezee rubber: 80° speed of the squeezee: 15 cm/sec pressure of the squeezee: 0.5 kg/cm$^2$ number of shots of the squeezee: 2 times (successively)

The insulating mixture layers thus screen printed are left unchanged at the room temperature for 15 minutes or longer to increase their surface smoothness and to remove bubbles generated within their surfaces.

Figure 1C:
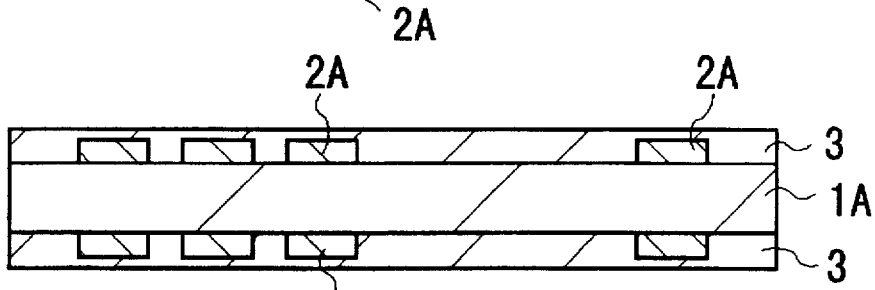

Thus, the first insulating layers 3 are formed on the two surfaces of the substrate 1A, respectively, as shown in FIG. 1C.

Following this, to partially cure and dry the first insulating layers 3, the layers are exposed to UV light at a luminous energy of 3 J/cm$^2$.

On the other hand, a second insulating layer 4 is formed on a surface of a copper foil 5 serving as a second conductive layer to be coupled therewith. The second insulating layer 4 is made of a material having a thermosetting property that cures at a temperature of 120° C. or higher.

Here, the material of the second insulating layer 4 is an insulating mixture essentially consisting of a bisphenol A epoxy resin of 60 to 70 weight %, a dicyandiamide of 20 to 30 weight % as a thermally curing agent, an epoxy acrylate of 5 to 10 weight %, and a cyclohexanone serving as a solvent. The mixture has a viscosity of 1 to 5 poises.

The mixture of the second insulating layer 4 is coated on a surface of the copper foil 5 to have a thickness of 50 to 55 µm. This coating process may be performed, for example, by a dice coating, knife coating, or curtain coating process. The coated mixture is then dried at a temperature of 60° to 80° C. for 3 to 10 minutes. Thus, the second insulating layer 4 is formed on the surface of the copper foil 5, and is coupled with the foil 5.

The combination of the second insulating layer 4 and the copper foil 5 is laminated under heat on the partially-cured first insulating layers 3 so that the second insulating layer 4 is contacted with the first insulating layers 3, respectively.

Figure 2:
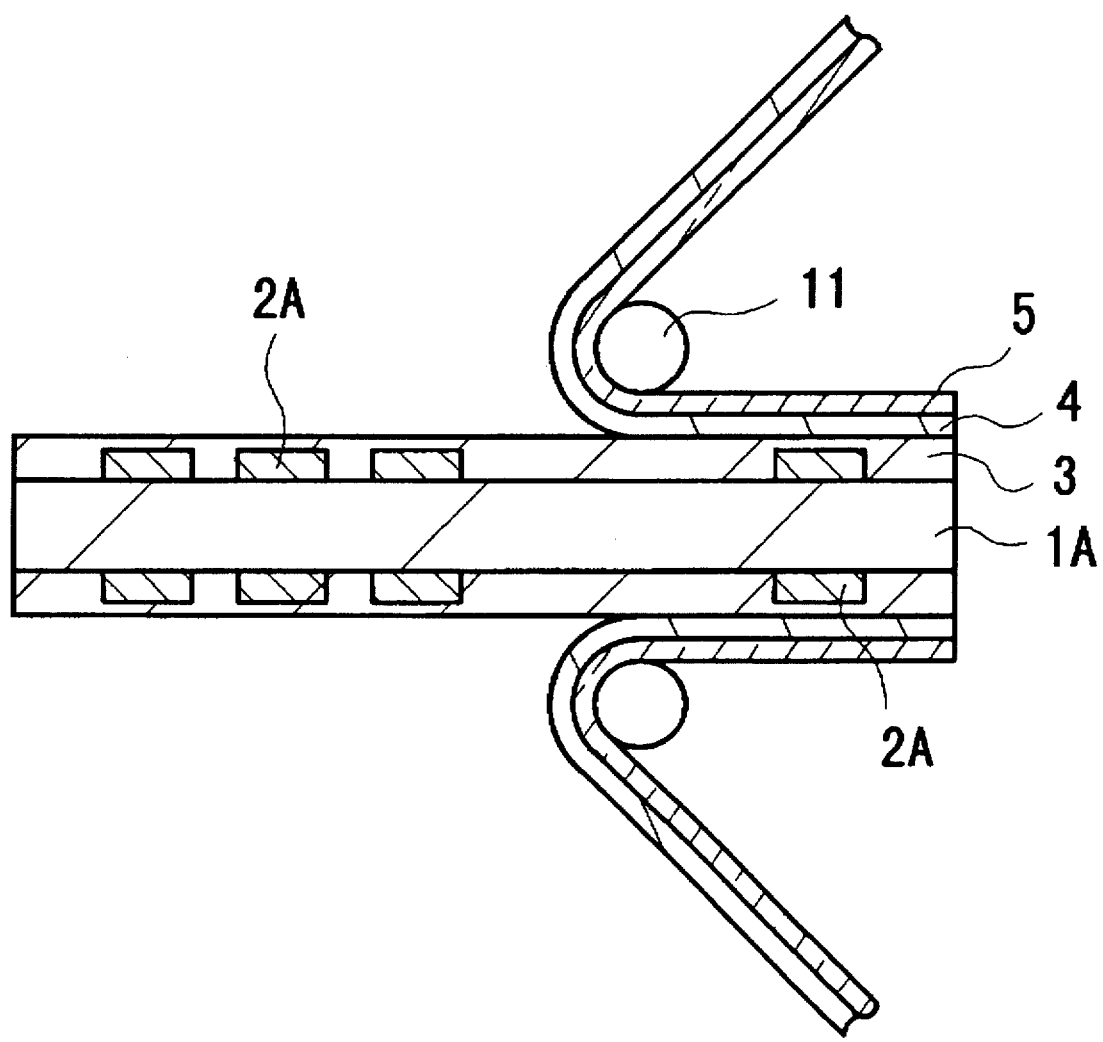
FIG. 2 is a partial cross-sectional view showing the lamination process of the combination of the second insulating layer and the second conductive layer on the first insulating layer in the fabrication method according to the embodiment, which corresponds to the step of FIG. 1D.

This lamination process is performed by using a roll laminator, as shown in FIG. 2. The roll laminator includes two rolls 11 placed at each side of the substrate 1A. The combination of the copper foil 5 and the second insulating layer 4 is wound around the respective rolls 11. The combination of the foils 5 and layers 4 thus wound around the rolls 11 are synchronously pulled out and simultaneously laminated on the corresponding first insulating layers 3, respectively.

The temperature of the rolls 11 is set as 100° C. to 120° C. The laminating pressure is set as 3 to 6 kg/cm$^2$. The laminating speed is set as 0.5 to 2.0 m/min.

During this lamination step, the first insulating layers 3 are heated through the corresponding rolls 11 that has been heated to the temperature of 100° to 120° C. Therefore, the first insulating layers 3 are heated up to the softening temperature of 50° C., thereby softening the first insulating layers 3 to reduce their surface irregularity.

Figure 1D:
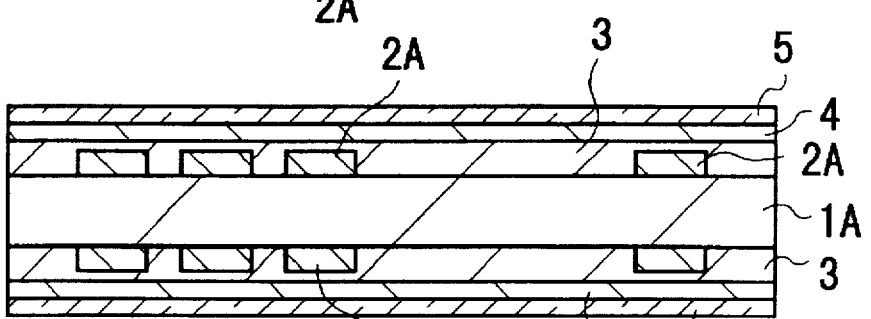

The first and second insulating layers are then heated or baked at a temperature of 140° to 160° C. for 30 to 60 minutes, thereby entirely curing the first and second insulating layers 3 and 4 and combining the substrate 1A, the patterned first conductive layers or inner circuits 2A, the first insulating layers 3, the second insulating layers 4, and the copper foils or second conductive layers 5 with each other. The state at this stage is shown in FIG. 1D.

Figure 1E:
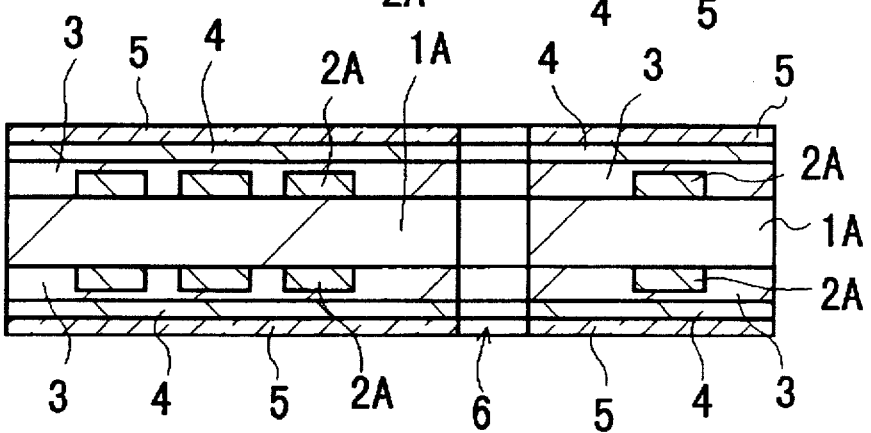

Thereafter, penetrating holes 6 (only one of which is shown here for the sake of simplification) are formed to vertically penetrate the substrate 1A, the first and second insulating layers 3 and 4, and the copper foils 5, as shown in FIG. 1E.

The assembly of the substrate 1, the inner circuits 2A, the first and second insulating layers 3 and 4, and the copper foils 5 thus formed is subjected to a known panel plating process of a conductive metal. Thus, as shown in FIG. 1F, the entire surfaces of the copper foils 5 and the entire inner walls of the penetrating holes 6 are covered with plated metal layers 7, respectively.

Next, dry-film photoresist layers (not shown) are laminated on the plated metal layers 7 and, masking films (not shown) are formed on the photoresist layers, respectively. Then, the photoresist layers are exposed to UV light through the masking films, thereby selectively curing the photoresist layers. The cured photoresist layers are developed to selectively remove the exposed or unexposed areas of the photoresist layers, resulting in patterned etching resists 8 on the plated metal layers 7, respectively. The state at this stage is shown in FIG. 1G.

Subsequently, using the patterned etching resists 8 as masks, the copper foils B and the plated metal layers 7 are selectively etched to form wanted outer circuits 9 on the respective second insulating layers 4. At the same time, plated through holes 6A are formed, which electrically connect the outer circuits 9 located on the two sides of the substrate to each other. The etching resists 8 are then removed. The state at this stage is shown in FIG. 1H.

Finally, solder resist layers 10 are selectively formed on the outer circuits 9 and the exposed second insulating layers 4, respectively, as necessary, as shown in FIG. 1I. Thus, the multilayer PWB is obtained.

With the fabrication method according to the embodiment of the present invention, as described above, after preparing the insulating substrate 1A having the inner circuits 2A, the first insulating layers 3 serving as undercoating layers are formed on the first conductive layers and the exposed surfaces of the substrate 1A, respectively.

Then, the combination of the second insulating layer 4 and the copper foil 5 is laminated on the partially-cured first insulating layers 3 under heat so that the second insulating layers are contacted with the corresponding first insulating layers 3. During this step, the first insulating layers are heated and softened to reduce their surface irregularity.

Further, the first and second insulating layers 3 and 4 are heated so that they are entirely cured, thereby combining the insulating substrate 1A having the inner circuits 2A, the first insulating layers 3, the second insulating layers 4, and the copper foils 5 with each other.

Therefore, no assembly process and no pressing process are required.

Also, the copper foils 5 are patterned to form the outer circuits 9 together with the plated metal layers 7. In other words, the outer circuits 9 a formed with the use of a subtractive process. As a result, the multilayer PWB is able to be fabricated at low fabrication cost without arising the above-described problems.

During the lamination process of the copper foils 5 and the second insulating layers 4 under heat, the first insulating layers 3 are heated to be softened, thereby reducing their surface irregularity. As a result, no polishing process of the partially-cured first insulating layers 3 are needed.

In the above embodiment, a two-sided copper clad laminate 1 is used and the fabricated multilayer PWB has two inner circuits 2A and two outer circuits 9 on each side of the laminate 1. However, it is needless to say that a single-sided copper clad laminate may be used in the present invention. In this case, the fabricated multilayer PWB has a single inner circuit and a single outer circuit.

While the preferred form of the present invention has been described, it is to be understood that modifications will be apparent to those skilled in the art without departing from the spirit of the invention. The scope of the invention, therefore, is to be determined solely by the following claims.

What is claimed is:

1. A fabrication method of a multilayer printed wiring board, said method comprising the steps of:

(a) preparing an insulating substrate having a first patterned conductive layer serving as an inner circuit;
said first patterned conductive layer being adhered on a surface of said substrate;

(b) forming a first insulating layer serving as an undercoating layer on said first conductive layer and said uncovered surface of said substrate;
said first insulating layer being made of a material having a photo-setting property that cures due to exposure to light, a softening property that softens at a first temperature higher than a room temperature, and a thermosetting property that cures at a second temperature or higher;
said second temperature being higher than said first temperature;

(c) exposing said first insulating layer to light, thereby partially curing said first insulating layer;

(d) forming a second insulating layer on a surface of a second conductive layer to be coupled therewith;
said second insulating layer being made of a material having a thermosetting property that cures at a third temperature or higher;
said third temperature being higher than said first temperature;

(e) laminating said combination of said second insulating layer and said second conductive layer under heat on said partially-cured first insulating layer so that said second insulating layer is contacted with said first insulating layer;
during this step, said first insulating layer being heated up to said first temperature, thereby softening said first insulating layer to reduce its surface irregularity;

(f) heating said first and second insulating layers at a temperature equal to or higher than said second and third temperatures, thereby entirely curing said first and second insulating layers and combining said substrate, said first conductive layer, said first insulating layer, said second insulating layer, and said second conductive layer with each other;

(g) forming holes to vertically penetrate said substrate; and (h) patterning said second conductive layer to form an outer circuit.

2. The method as claimed in claim 1, wherein said first temperature of said first insulating layer is in the range from 50° C. to a temperature at which the glass transition phenomenon of said material of said first insulating layer starts.

3. The method as claimed in claim 1, wherein said first temperature of said first insulating layer is in the range from 60° C. to 80° C.

4. The method as claimed in claim 1, wherein said material of said first insulating layer is an insulating mixture essentially consisting of a bisphenol A epoxy resin, an acrylic polymer, an epoxy acrylate, a photo-polymerization initiating agent, and a thermally curing agent.

5. The method as claimed in claim 1, wherein said material of said second insulating layer is an insulating mixture essentially consisting of a bisphenol A epoxy resin, a thermally curing agent, and a solvent;
and wherein said mixture is coated on the surface of said second insulating layer and is then dried, thereby forming said second insulating layer.

6. The method as claimed in claim 1, wherein the combination of said second conductive layer and said second insulating is laminated by using a roll laminator;
and wherein said roll laminator includes a roll on which the combination of said second conductive layer and said second insulating is wound;
and wherein during said lamination step, said first insulating layer is heated through said roll that has been heated.

* * * * *